(12) United States Patent
Shu et al.

(10) Patent No.: US 11,908,917 B2
(45) Date of Patent: Feb. 20, 2024

(54) GATE STRUCTURES

(71) Applicant: GLOBALFOUNDRIES U.S. INC., Malta, NY (US)

(72) Inventors: Jiehui Shu, Dalian (CN); Sipeng Gu, Clifton Park, NY (US); Haiting Wang, Clifton Park, NY (US)

(73) Assignee: GLOBALFOUNDRIES INC., Malta, NY (US)

(*) Notice: Subject to any disclaimer, the term of this patent is extended or adjusted under 35 U.S.C. 154(b) by 95 days.

(21) Appl. No.: 17/404,499

(22) Filed: Aug. 17, 2021

(65) Prior Publication Data

US 2021/0376106 A1 Dec. 2, 2021

Related U.S. Application Data

(62) Division of application No. 16/599,684, filed on Oct. 11, 2019, now Pat. No. 11,127,834.

(51) Int. Cl.

| | |
|---|---|
| *H01L 29/49* | (2006.01) |
| *H01L 29/66* | (2006.01) |
| *H01L 27/088* | (2006.01) |
| *H01L 29/78* | (2006.01) |
| *H01L 29/40* | (2006.01) |

(52) U.S. Cl.
CPC ...... *H01L 29/4983* (2013.01); *H01L 27/0886* (2013.01); *H01L 29/401* (2013.01); *H01L 29/66545* (2013.01); *H01L 29/785* (2013.01); *H01L 29/66795* (2013.01)

(58) Field of Classification Search
CPC ............. H01L 29/4983; H01L 29/401; H01L 29/66545; H01L 29/785; H01L 29/66795; H01L 29/4966; H01L 27/0886

USPC .......................................... 257/401, 369, 288
See application file for complete search history.

(56) References Cited

U.S. PATENT DOCUMENTS

| | | | |
|---|---|---|---|
| 7,638,428 B2 * | 12/2009 | Streck | H01L 21/28518 |
| | | | 438/650 |
| 8,748,215 B2 | 6/2014 | Yamazaki | |
| 9,196,542 B2 | 11/2015 | Wang et al. | |
| 9,209,177 B2 | 12/2015 | Kim et al. | |
| 10,431,673 B2 * | 10/2019 | Kim | H01L 21/823821 |
| 10,804,157 B2 * | 10/2020 | Zhao | H01L 21/823821 |
| 10,930,509 B2 * | 2/2021 | Kim | H01L 21/762 |
| 2002/0137345 A1 | 9/2002 | Yue et al. | |
| 2007/0155157 A1 * | 7/2007 | Chou | H01L 21/76829 |
| | | | 438/618 |
| 2010/0181630 A1 | 7/2010 | Bu et al. | |

(Continued)

OTHER PUBLICATIONS

Wen Wu et al."Gate Resistance Modeling of Multifin MOS Devices", IEEE and Mansun Chan, Senior Member, IEEE, IEEE Electron Device Letters, vol. 27, No. 1, Jan. 2006, 3 pages.

*Primary Examiner* — Dao H Nguyen
(74) *Attorney, Agent, or Firm* — Francois Pagette; Andrew M. Calderon; Calderon Safran & Cole P.C.

(57) ABSTRACT

The present disclosure generally relates to semiconductor structures and, more particularly, to gate structures and methods of manufacture. The method includes: forming a first gate structure and a second gate structure with gate materials; etching the gate materials within the second gate structure to form a trench; and depositing a conductive material within the trench so that the second gate structure has a metal composition different than the first gate structure.

18 Claims, 6 Drawing Sheets

(56) References Cited

U.S. PATENT DOCUMENTS

| | | |
|---|---|---|
| 2011/0133273 A1 | 6/2011 | Shima |
| 2011/0147765 A1 | 6/2011 | Huang et al. |
| 2016/0099181 A1 | 4/2016 | Tung |
| 2016/0268259 A1* | 9/2016 | Chang ................... H01L 27/092 |
| 2016/0276429 A1* | 9/2016 | Tseng .............. H01L 21/823431 |
| 2017/0012000 A1* | 1/2017 | Tseng ................... H01L 29/165 |
| 2017/0025540 A1* | 1/2017 | Liou ................... H01L 29/0653 |

* cited by examiner

US 11,908,917 B2

GATE STRUCTURES

FIELD OF THE INVENTION

The present disclosure generally relates to semiconductor structures and, more particularly, to gate structures and methods of manufacture.

BACKGROUND

As semiconductor processes continue to scale downwards, e.g., shrink, the desired spacing between features (i.e., the pitch) also becomes smaller. To this end, in the smaller technology nodes it becomes ever more difficult to fabricate features due to the critical dimension (CD) scaling and process capabilities.

In radio frequency (RF) applications, device performance is affected by gate resistance (Rg). Specifically, the high-frequency performance metric Fmax of RF transistors becomes degraded as Rg increases. Conventional devices attempt to reduce Rg by increasing the gate length (Lg) of the RF transistor. However, increasing Lg degrades another high-frequency performance metric Ft of the RF transistor. Accordingly, typical devices have diminished device performance because of the degraded Ft.

SUMMARY

In an aspect of the disclosure, a method comprises: forming a first gate structure and a second gate structure with gate materials; etching the gate materials within the second gate structure to form a trench; and depositing a conductive material within the trench so that the second gate structure has a metal composition different than the first gate structure.

In an aspect of the disclosure, a method comprises: forming a plurality of gate structures comprising gate materials over a device region; forming a trench in the gate materials within at least one gate structure in a non-device region; and depositing a gate metal within the trench to form a metal composition different than a metal composition of remaining gate structures.

In an aspect of the disclosure, a structure comprises: a first gate structure, a second gate structure, and a third gate structure, the second gate structure being positioned between and abutting the first gate structure and the third gate structure; and conductive materials in the first, second, and third gate structures, the conductive materials of the second gate structure being different than the first gate structure and the third gate structure.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1A:
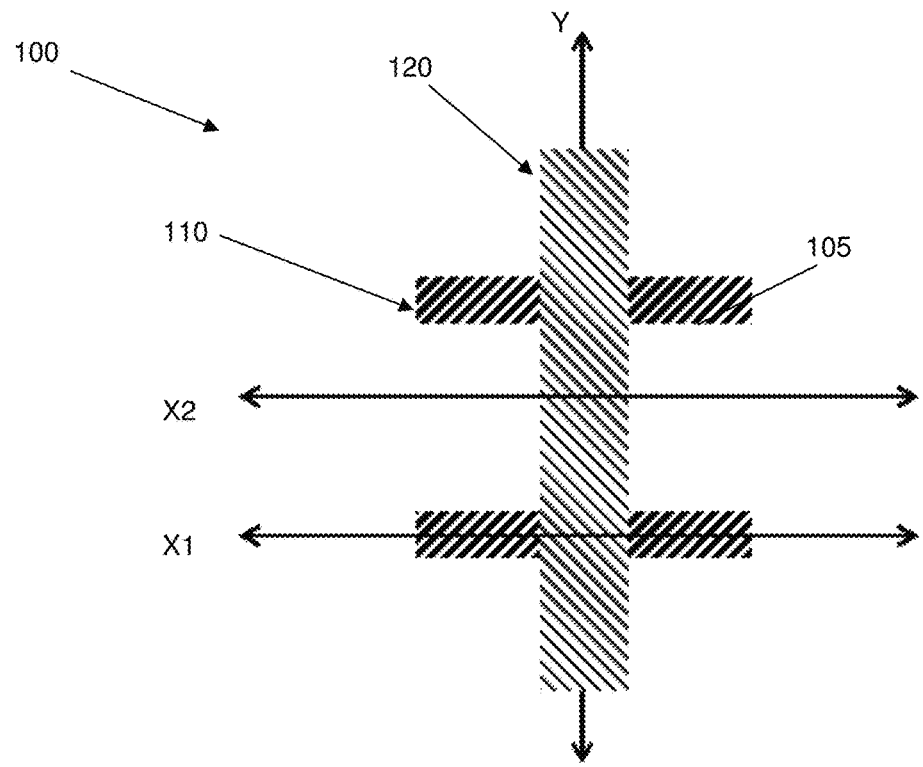
FIGS. 1A-1D show dummy gate structures, amongst other features, and respective fabrication processes in accordance with aspects of the present disclosure.

The present disclosure generally relates to semiconductor structures and, more particularly, to gate structures and methods of manufacture. In embodiments, the processes and structures provided herein remove excess gate fill materials and high-k dielectric materials in non-device regions in order to reduce the gate resistance (Rg). Advantageously, by reducing Rg, degradation of Fmax is prevented, thereby improving radio frequency (RF) device performance.

The processes and structures described herein remove excess metal gate materials and high-k dielectric materials at non-device regions of the RF transistor to reduce Rg. By removing excess gate materials, the structures and processes described herein allow for relatively more tungsten (W) fill to occur within the gate structure at the top of shallow trench isolation (STI) regions, i.e., the non-device regions. Also, by removing excess metal gate fill materials and high-k dielectric materials at the non-device region of the RF transistor, the composition of the metal materials between fin structures is different than the composition of the metal materials around the fin structures.

Accordingly, the gate structures at device regions will have a metal gate composition different than the metal composition of the metal material between the fin structures and the gate structures at the non-device regions. Moreover, removing excess gate metal materials and high-k dielectric materials reduces a first resistance R1 in a multi-fin MOS device. Reducing R1 correlates to a reduction in the series resistance (Rs) of the multi-fin MOS device, while there is no change of the gate metal material of the gate structures at the device regions. Reducing Rs further improves RF device performance because it also reduces degradation of Fmax.

In embodiments, the structures and processes described herein provide for a structure which comprises a pair of fins surrounded by an STI layer. Further, a gate cavity is transverse to and above the pair of fins and over the STI layer. A first metallic layer in the gate cavity is on the pair of fins and partially on the STI layer. A second metallic layer is on the first metallic layer and on the STI layer. In embodiments, the above structure further comprises a contact on the second metallic layer, wherein the contact is laterally outside the pair of fins. In embodiments, there is more of a tungsten (W) fill inside the gate structure on top of the STI layer than found in typical devices. In further embodiments, the gate structure can be lined with a metal composition that is different between the fins than around the fins.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structure of the present disclosure have been adopted from integrated circuit (IC) technology. For example, the structures are built on wafers and are realized in films of material patterned by photolithographic processes on the top of a wafer. In particular, the fabrication of the structure uses three basic building blocks: (i) deposition of thin films of material on a substrate, (ii)

applying a patterned mask on top of the films by photolithographic imaging, and (iii) etching the films selectively to the mask.

Figure 1B:
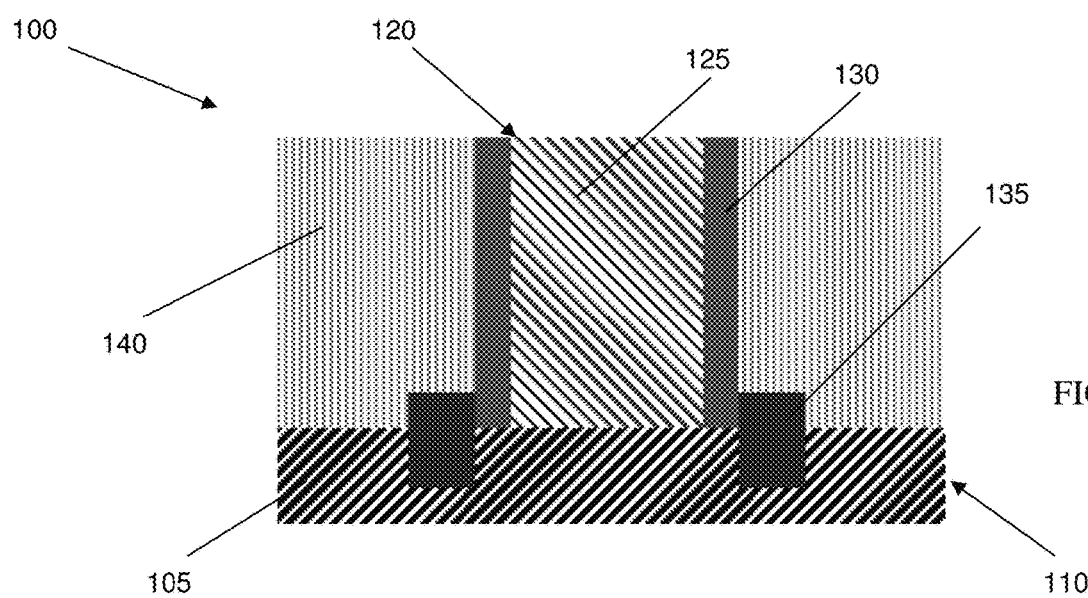
Figure 1C:
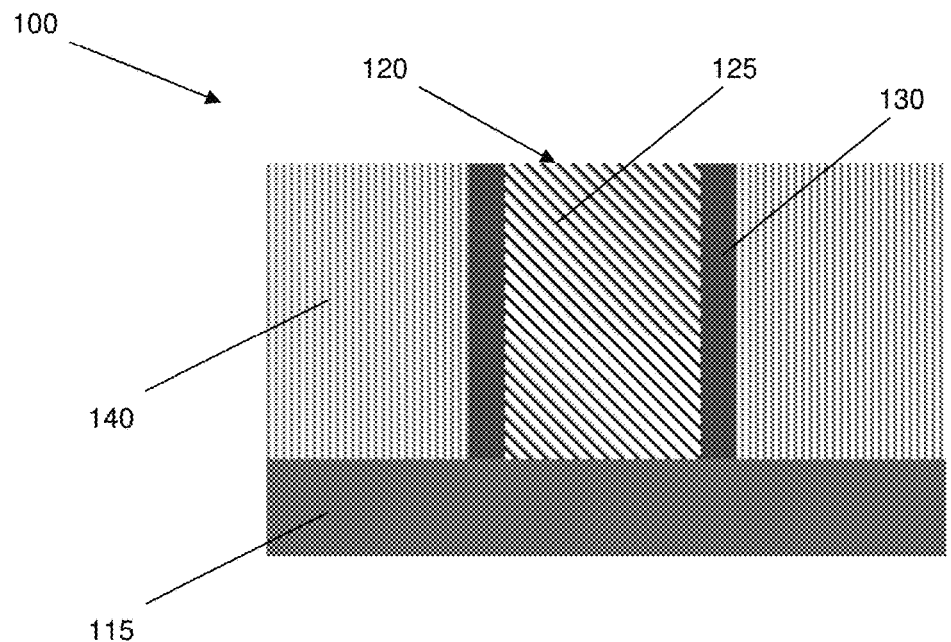
Figure 1D:
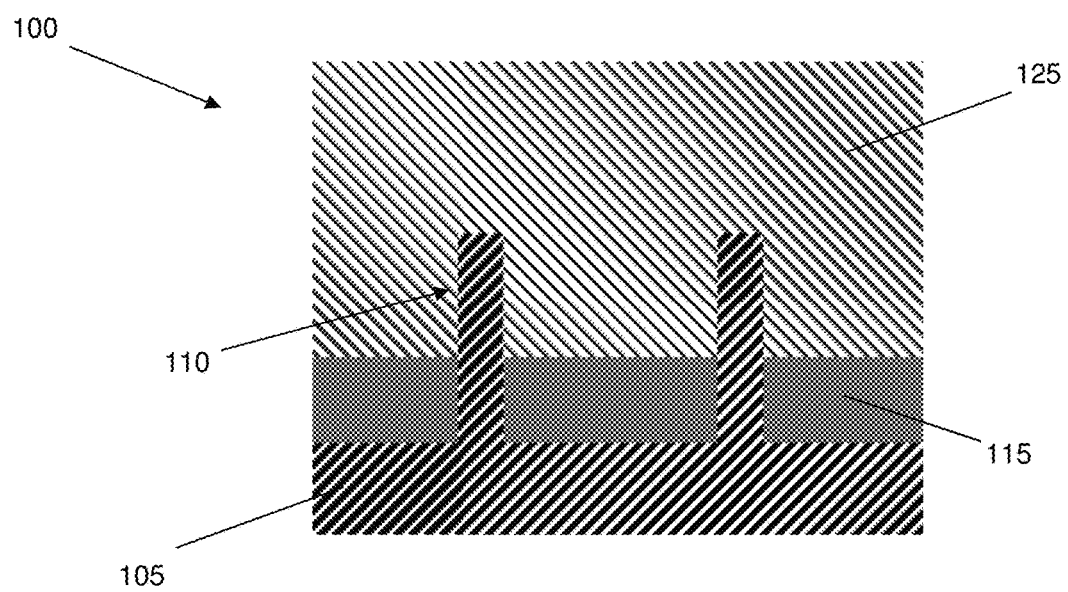

FIGS. 1A-1D show an incoming structure and respective fabrication processes in accordance with aspects of the present disclosure. Specifically, FIG. 1A depicts a top view of a structure 100; whereas, FIG. 1B depicts the structure 100 along an X1-axis of FIG. 1A, FIG. 1C depicts the structure 100 along an X2-axis of FIG. 1A and FIG. 1D depicts the structure 100 along a Y-axis of FIG. 1A. Specifically, the X1-axis is a perspective over a device region 110 and/or a device structure of the structure 100, while the X2-axis is a perspective over a non-device region 115. The Y-axis is a perspective view over a gate structure 120. In embodiments, the device region 110 can include a fin structure 110, or an active region of a planar structure to cover FDSOI, e.g. substrate 105. In further embodiments, the non-device region 115 can include a shallow trench isolation (STI) region. The fin structures 110 are composed of a suitable semiconductor material 105. As an example, the fin structures 110 may be composed of any suitable semiconductor material 105 including, but not limited to, Si, SiGe, SiGeC, SiC, GaAs, InAs, InP, etc.

The fin structures 110 can be fabricated using a sidewall image transfer (SIT) technique. In an example of a SIT technique, a mandrel material, e.g., $SiO_2$, is deposited on a substrate using conventional chemical vapor deposition (CVD) processes. A resist is formed on the mandrel material and exposed to light to form a pattern (openings). A reactive ion etching is performed through the openings to form the mandrels. In embodiments, the mandrels can have different widths and/or spacing depending on the desired dimensions of the fin structures. Spacers are formed on the sidewalls of the mandrels which are preferably material that is different than the mandrels, and which are formed using conventional deposition processes known to those of skill in the art. The spacers can have a width which matches the dimensions of the fin structures, for example. The mandrels are removed or stripped using a conventional etching process, selective to the mandrel material. An etching is then performed within the spacing of the spacers to form the sub-lithographic features, e.g., for structures. The sidewall spacers can then be stripped.

Still referring to FIGS. 1A-1D, gate structures 120 are formed on the fin structures 110 and on shallow trench isolation (STI) regions 115 between the fin structures 110. In embodiments, the gate structures 120 are composed of a dummy gate material 125, e.g., amorphous Si (α-Si). The gate structures 120 further include sidewall spacers 130, e.g., a low-k dielectric, which can be deposited on the sidewalls of the gate structures 120. The sidewall spacers 130 can be deposited by a conventional chemical vapor deposition (CVD) process followed by a patterning process, e.g., anisotropic etching process, to remove any material from horizontal surfaces of the structure 100.

Source and drain regions (S/D) regions 135 are formed on sides of the gate structures 120, e.g., sides of the sidewall spacers 130, on the fin structures 110 using, e.g., any conventional method. For example, the S/D regions 135 can be raised S/D regions formed by a doped epitaxial growth process on the surfaces of the fin structures 110, within openings between the gate structures 120. In further embodiments, the S/D regions 135 can be formed by an ion implantation process, doping process or through a diffusion processes, as is well known to those of skill in the art such that no further explanation is required for an understanding of the present disclosure.

An interlevel dielectric (ILD) 140 is deposited over the S/D regions 135. The ILD 140 can be deposited by CVD processes and is composed of oxide, for example. After deposition, the ILD 140 is planarized by a chemical mechanical polishing (CMP) process to a level of the gate structures 120.

Figure 2A:
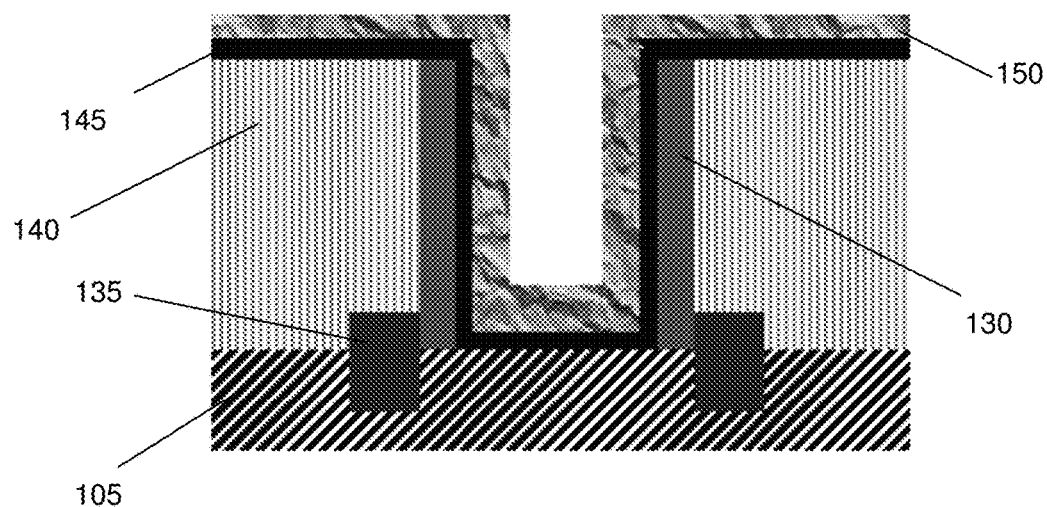
FIGS. 2A-2C show gate materials, amongst other features, and respective fabrication processes in accordance with aspects of the present disclosure.
Figure 2B:
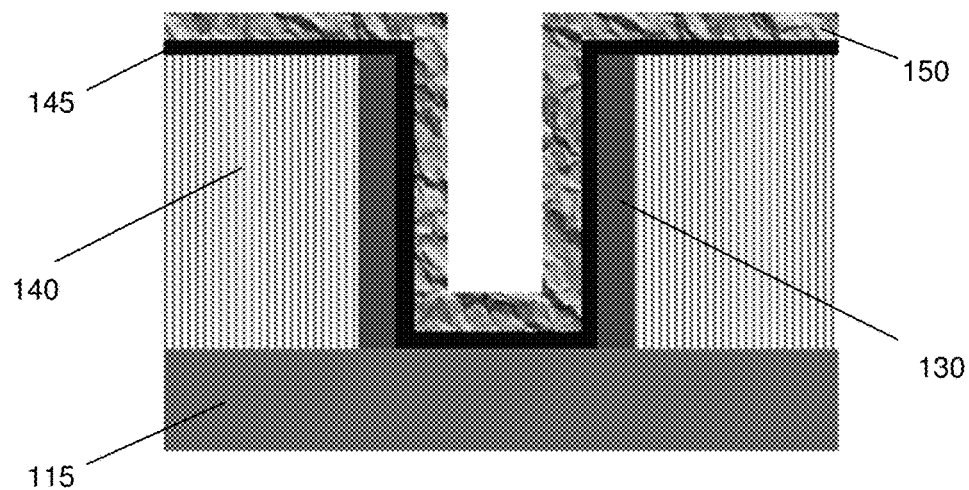
Figure 2C:
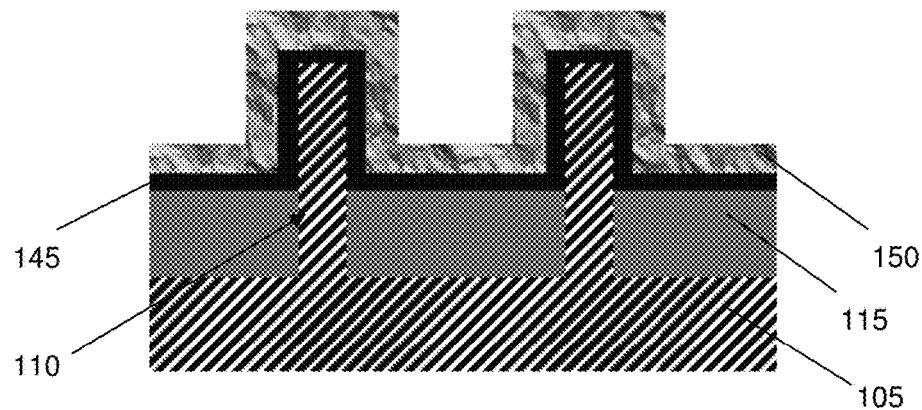

FIGS. 2A-2C show removal of the dummy gate material 125 and the deposition of a gate dielectric 145 and a gate metal 150 over the fin structures 110, with FIG. 2A being along the X1 axis of FIG. 1A, FIG. 2B being along the X2 axis of FIG. 1A and FIG. 2C being along the Y axis of FIG. 1A. In embodiments, the dummy gate material 125 is removed by a maskless etching process, e.g., a wet etch or dry etch process, due to its selectivity with respect to the semiconductor material 105 and the material of the sidewall spacers 130. The removal of the dummy gate material 125 will expose surfaces of the fin structures 110 and form a trench between the sidewall spacers 130. The gate dielectric 145 is deposited within the trench on the semiconductor material 105, the sidewall spacers 130 and the ILD 140. In embodiments, the gate dielectric 145 can be, e.g., a high-k gate dielectric material, e.g., hafnium-based dielectrics. In further embodiments, the high-k dielectric materials can include, but are not limited: HfO2, $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof.

The gate dielectric 145 can be deposited using an atomic layer deposition (ALD) process, a plasma enhanced chemical vapor deposition (PECVD) process or a low-pressure chemical vapor deposition (PECVD) process over the fin structures 110 and on sides of the sidewall spacers 130. Deposition of the gate dielectric 145 is followed by a deposition of the gate metal 150 over the gate dielectric 145. The gate metal 150 is deposited by atomic layer deposition (ALD) processes and is composed of any metal or any combination of metals, e.g., TiN/TiAlC, depending on the application and design parameters.

Figure 3A:
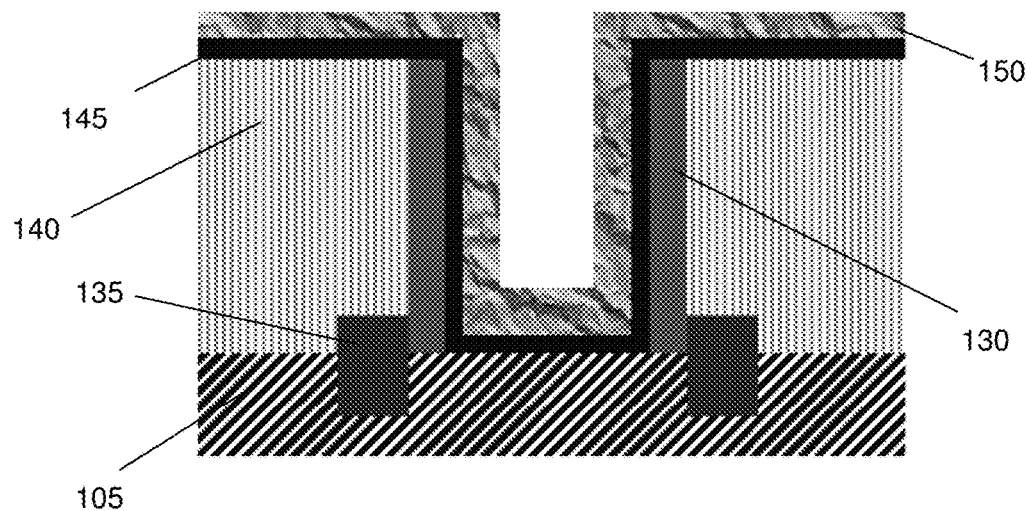
FIGS. 3A-3C show removal of gate materials over a non-device region, amongst other features, and respective fabrication processes in accordance with aspects of the present disclosure.
Figure 3B:
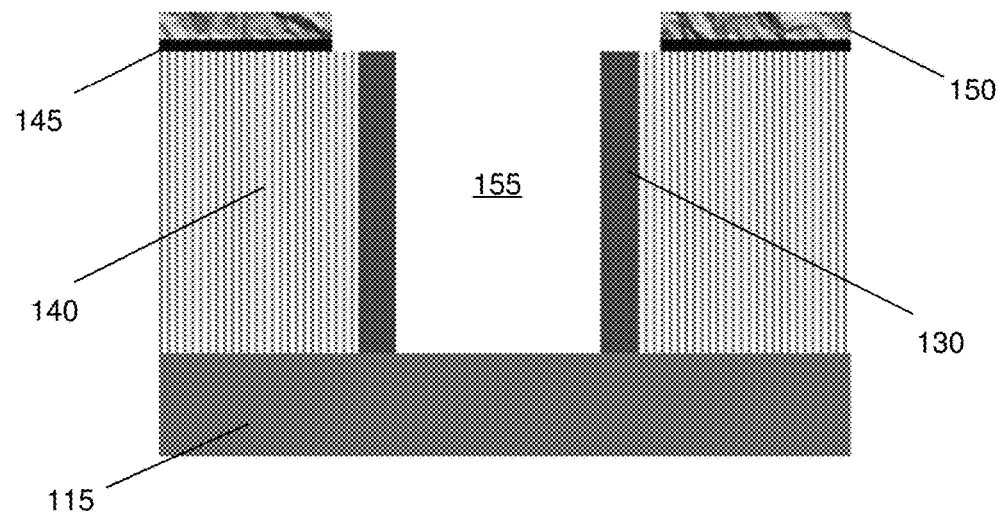
Figure 3C:
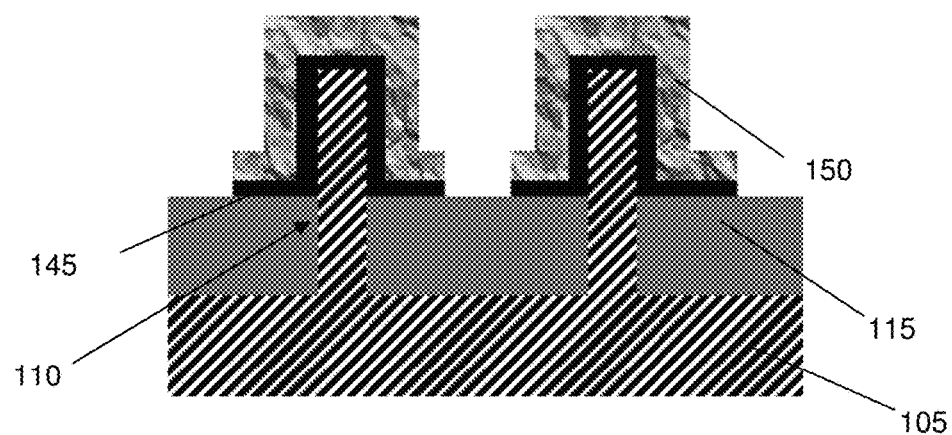

FIGS. 3A-3C show removal of the gate materials, i.e., gate dielectric 145 and gate metal 150, from non-device regions of the structure 100. Specifically, FIG. 3A is a view along the X1 axis of FIG. 1A, FIG. 3B is a view along the X2 axis of FIG. 1A and FIG. 3C is a view along the Y axis of FIG. 1A. In embodiments, a photoresist or an organic planarization layer (OPL) is applied to device areas (fin structures 110) of the structure 100, thereby leaving exposed the gate materials 145, 150 situated in the non-device regions, i.e., the STI regions 115, of the structure 100. In embodiments, the OPL is applied by a spin-coating process to blanket-deposit the OPL material over a top surface of the gate metal 150.

A selective etching process, e.g., a wet etch or dry etch process, patterns the exposed portions of the gate metal 150 and the gate dielectric 145 in the non-device regions of the structure 100. In this way, a trench 155 is formed over the non-device regions of the structure 100, as illustrated in FIG. 3B, with a gate cavity (trench 155) above the pair of fin structures 110 and over the STI regions 115. In embodiments, etching the gate materials 145, 150 within the second gate structure, i.e., gate structure 165a, is a maskless process. In further embodiments, it is contemplated that the gate dielectric 145 can remain within the trench 155, while the gate metal 150 is removed from the non-device regions of the structure 100. The photoresist or OPL material is removed by a conventional removal process, e.g., oxygen ashing, $H_2N_2$ ashing or SOH stripping.

Figure 4A:
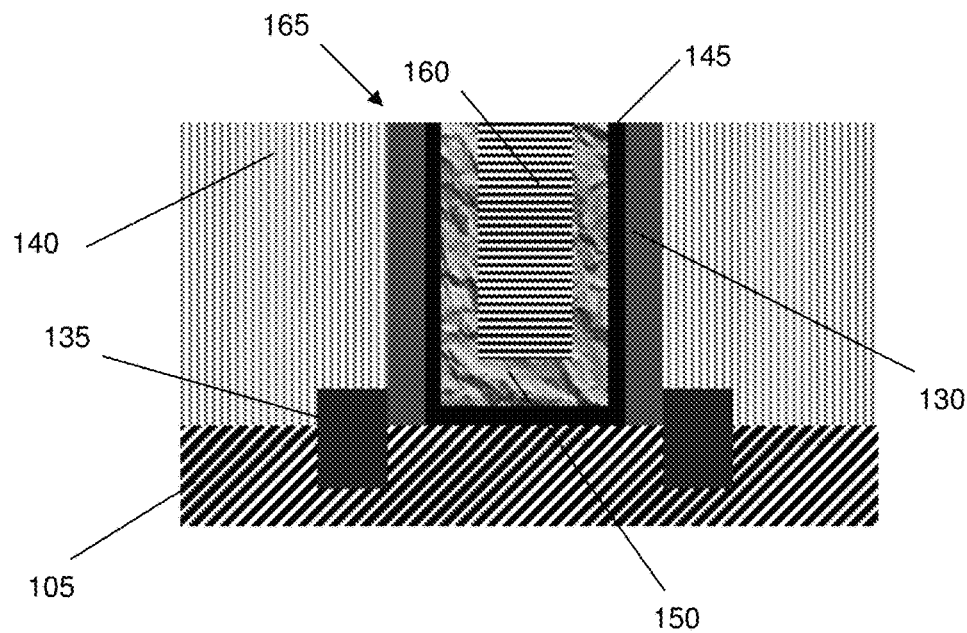
FIGS. 4A-4C show replacement gate structures, amongst other features, and respective fabrication processes in accordance with aspects of the present disclosure.
Figure 4B:
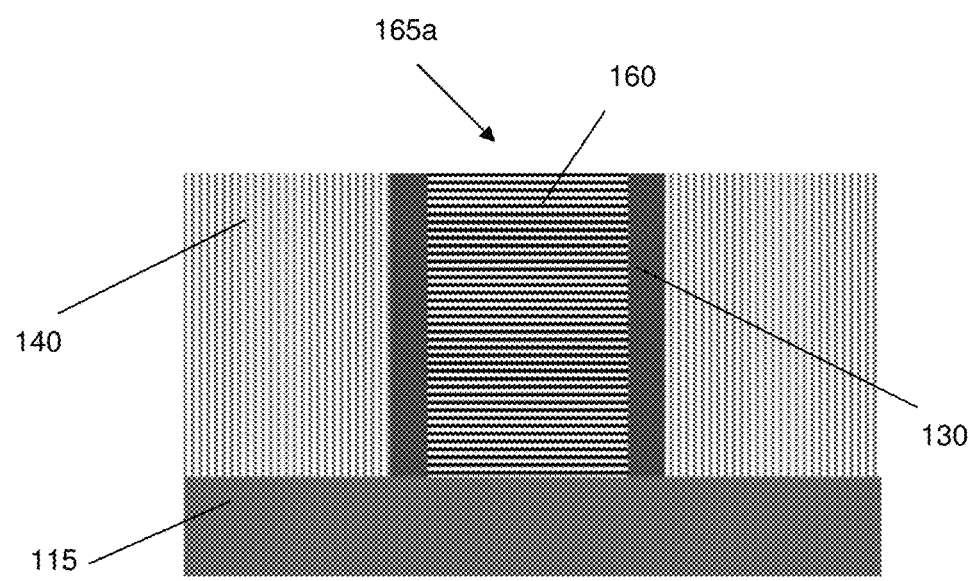
Figure 4C:
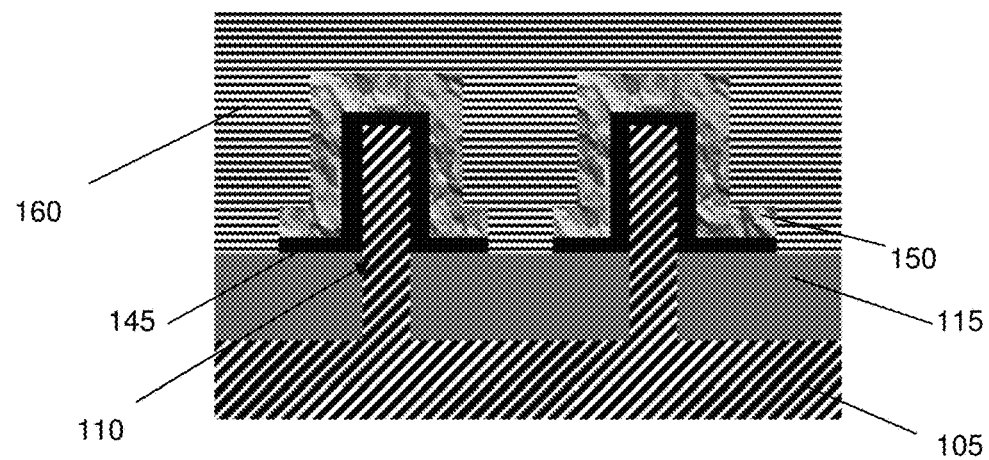

FIGS. 4A-4C show the deposition of a gate metal 160 to form replacement gate structures 165, 165a, thereby forming a multi-fin MOS device. Specifically, FIG. 4A is a view along the X1 axis of FIG. 1A, FIG. 4B is a view along the X2 axis of FIG. 1A and FIG. 4C is a view along the Y axis of FIG. 1A. In embodiments, the gate metal 160 is deposited within the trench 155 and over the gate metal 150 by CVD processes. Accordingly, the processes described herein include depositing the gate metal 160 over the gate materials 145, 150 in the remaining gate structures, i.e., gate structures 165. In this way, the process includes depositing the gate metal 160 over the fin structures 110. Specifically, the process includes depositing the gate metal between the fin structures.

The gate metal 160 can be composed of any suitable conductive material such as a tungsten (W) material, e.g., fluorine-free tungsten (FFW). By removing the gate dielectric 145 and gate metal 150 and replacing them with the gate metal 160 in the non-device regions (STI regions 115) of the structure 100, the gate resistance (Rg) of the device can be reduced. In this way, the second gate structure, i.e., gate structure 165a, is formed at and over a non-device region. In embodiments, the gate materials 145, 150, 160 of the other gate structures 165 surround the fin structures 110. In further embodiments, the gate materials, i.e., gate metal 160, of the at least one gate structure, are between and over the fin structures 110.

Having a relatively larger amount of gate metal 160 over the STI regions 115 compared to an amount of gate metal 160 in the gate structure 165 in the device areas, allows for a first resistance (R1) in a multi-fin MOS device to be improved. Also, by replacing the gate metal 150 with the gate metal 160 over the non-device regions, the gap fill is improved because more metal fill, e.g., W fill, can be inside the gate structure 165a on top of STI regions 115, thereby improving R1.

Accordingly, the processes described herein include forming a first gate structure, i.e., gate structure 165, and a second gate structure, i.e., 165a, with gate materials 145, 150. Further, the process includes etching the gate materials 145, 150 within the second gate structure to form a trench 155. Additionally, the process includes depositing a conductive material, i.e., gate metal 160, within the trench 155 so that the second gate structure has a metal composition different than the first gate structure. In this way, the process described herein includes depositing the conductive material over the gate materials within the first gate structure.

In embodiments, the thicknesses of the gate metal 150 can be more than half of the width of the gate structure 165, while the gate metal 160 occupies the entire width of the gate structure 165a. In this way, the gate materials, i.e., gate metal 160, over the at least one gate structure, i.e., gate structure 165a, have a different thickness than the gate materials 145, 150 of the other gate structures 165. Moreover, improving R1 lowers the overall Rg of the device, which, in turn, prevents degradation of Fmax, hence improving radio frequency (RF) device performance. Further, improving R1 reduces the total series resistance (Rs) of the multi-fin MOS device. By reducing Rs, Fmax is further improved.

Figure 5A:
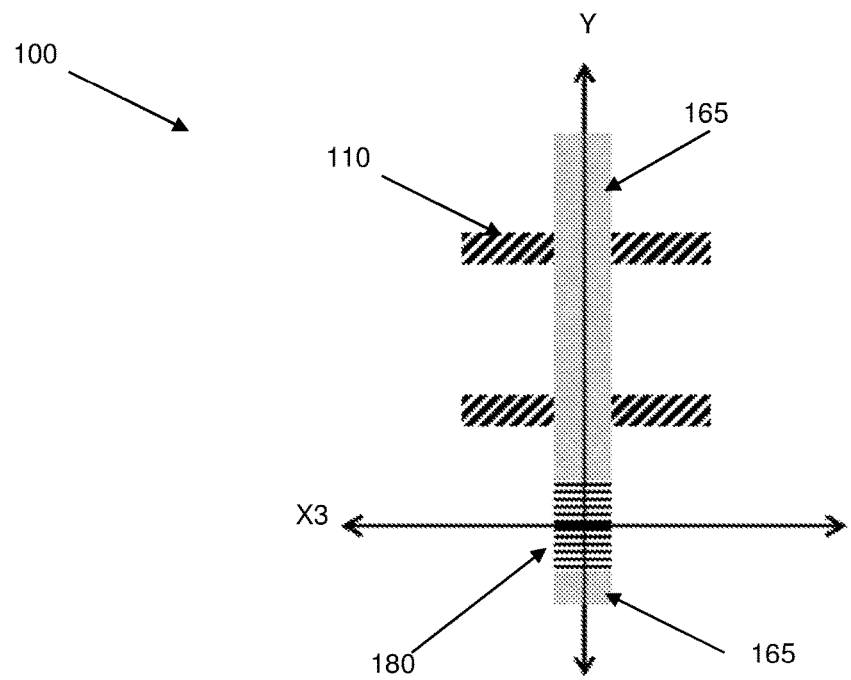
FIGS. 5A and 5B show a gate contact, amongst other features, and respective fabrication processes in accordance with aspects of the present disclosure.
Figure 5B:
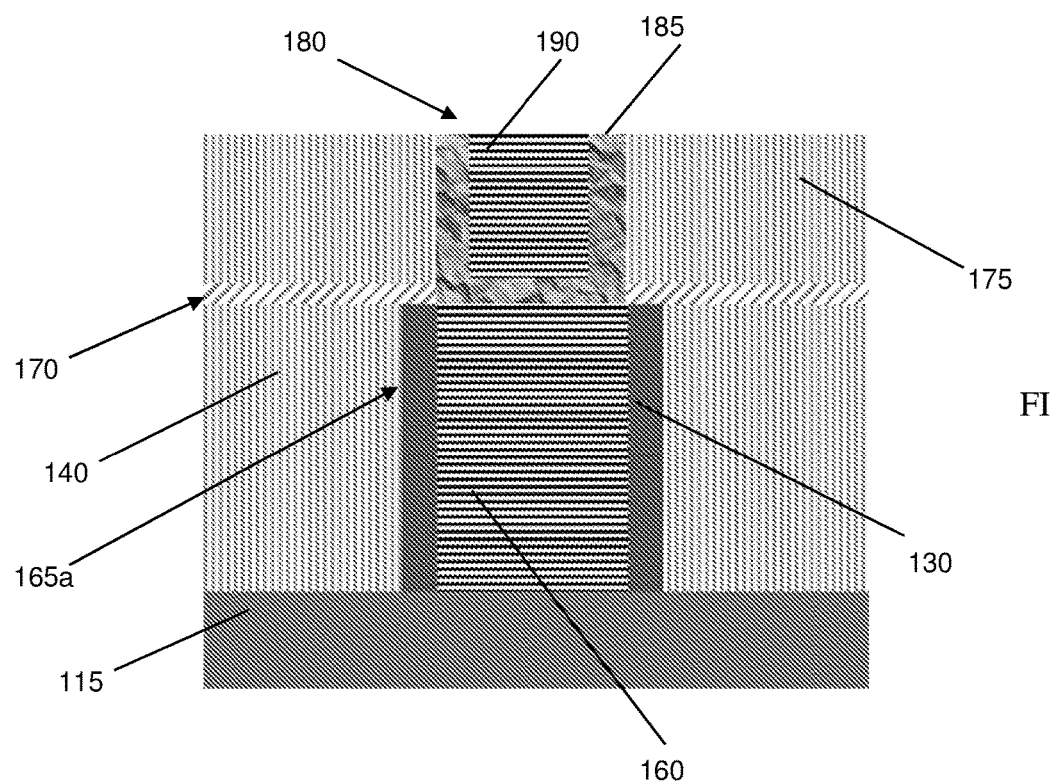

FIGS. 5A and 5B show the formation of a gate contact 180, with FIG. 5A illustrating a top view of the structure 100 and FIG. 5B being along the X3 axis of FIG. 5A. In embodiments, a capping layer 170 is deposited over the gate structure 165a. Specifically, the capping layer 170 is deposited over the ILD 140 by a CVD process, and can be composed of a nitride material, e.g., SiN. An ILD layer 175 is deposited over the capping layer 170 by CVD processes. In embodiments, the ILD layer 175 can be composed of an oxide material, for example. In this way, the processes described herein include forming a plurality of fin structures 110 and forming a plurality of gate structures 165, 165a comprising gate materials 145, 150 over the fin structures 110. Further, the process includes etching the gate materials 145, 150 from at least one gate structure, i.e., gate structure 165a, in a non-device region to form a trench 155 within the at least one gate structure. Additionally, the process includes depositing a gate metal 160, within the trench 155 to form a metal composition different than a metal composition of remaining gate structures, i.e., gate structures 165.

The gate contact 180 can be formed using conventional lithography and etching processes, e.g., a RIE process. For example, a resist formed over the ILD layer 175 is exposed to energy (light) to form a pattern (opening). An etching process with a selective chemistry, e.g., reactive ion etching (RIE), will be used to form one or more trenches in the ILD layer 175 through the openings of the resist. The resist can then be removed by a conventional oxygen ashing process, $H_2N_2$ ashing process or other known stripants.

The removal of the resist is followed by the formation of a metal seed and protection layer 185, e.g. Ti, Ta, TiN, TaN, Ti/TiN, Ta/TaN. In embodiments, the formation of the metal seed and protection layer 185 can include a physical vapor deposition (PVD) of about 4 nm of Ti, followed by an atomic layer deposition (ALD) of about 3.2 nm of TiN.

Following the seed metal layer process, a conductive metal 190 is deposited on the metal seed and protection layers 185, thereby forming the gate contact 180. Any residual conductive metal 190 on the surface of the ILD layer 175 can be removed by conventional CMP processes. The conductive metal 190 is composed of tungsten (W) material, such as fluorine-free tungsten (FFW), for example. The conductive metal 190 can be composed of cobalt (Co) or tungsten (W) or Ruthenium (Ru), for example.

Accordingly, the process described herein includes forming a gate contact 180 to the second gate structure, i.e., gate structure 165a. Further, forming the gate contact 180 comprises depositing a capping layer 170 over the second gate structure and depositing an interlevel dielectric 175 over the capping layer 170. Additionally, forming the gate contact 180 includes etching the interlevel dielectric 175 to form a trench, and depositing metal materials, i.e., metal material 185 and conductive metal 190 within the trench. In this way, the process of forming the gate contact 180 includes forming a gate contact over the non-device region, which includes depositing metal materials, i.e., conductive metal 190, in contact with the gate metal 160 of the at least one gate structure (gate structure 165a).

In further embodiments, a structure includes a plurality of fin structures 110 and a plurality of gate structures 165, 165a formed over the fin structures 110, the gate structures 165, 165a comprising gate materials 145, 150, 160. Further, at least one gate structure, i.e., gate structure 165a, has gate materials, i.e., metal gate 160, with a different composition than other gate structures 165. In embodiments, the gate materials over the at least one gate structure have a different thickness than the gate materials of the other gate structures.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
a first gate structure, a second gate structure, and a third gate structure, the second gate structure being positioned between and abutting the first gate structure and the third gate structure; and
conductive materials in the first, second, and third gate structures, the conductive materials of the second gate structure being different than the first gate structure and the third gate structure,
wherein the conductive materials comprise different materials from the first gate structure, the second gate structure, and the third gate structure, the conductive materials of the first gate structure and the third gate structure are over device regions, and the second gate structure is formed over a non-device region.

2. The structure of claim 1, wherein the second gate structure comprise gate materials with different thicknesses than the gate materials of the third gate structure.

3. The structure of claim 1, further comprising device regions, wherein the conductive materials of the first gate structure and the third gate structure surround the device regions.

4. The structure of claim 3, wherein the conductive materials of the second gate structure is between the device regions.

5. The structure of claim 1, wherein the device regions are fin structures comprised of a substrate material.

6. The structure of claim 5, wherein the non-device region is a shallow trench isolation (STI) region.

7. The structure of claim 6, further comprising a gate contact on an upper surface of the conductive materials of the second gate structure.

8. The structure of claim 7, wherein the gate contact includes a metal seed and protection layer on the upper surface of the conductive materials of the second gate structure.

9. The structure of claim 8, further comprising another conductive material on an upper surface of the metal seed and protection layer.

10. The structure of claim 9, wherein the second gate structure comprise gate materials with different thicknesses than the gate materials of the first and third gate structure.

11. The structure of claim 10, wherein the gate contact is over the non-device region.

12. The structure of claim 11, wherein the gate contact has a metal composition different than the second gate structure.

13. The structure of claim 1, wherein the second gate structure comprise gate materials with different thicknesses than the gate materials of the first gate structure.

14. The structure of claim 13, wherein the conductive materials are formed within a trench of the second gate structure.

15. The structure of claim 14, wherein the conductive materials are over metal gate materials of the first gate structure such that the second gate structure has a metal composition different than the first gate structure.

16. The structure of claim 15, wherein the metal gate materials in the first gate structure occupies at least half a width of the first gate structure.

17. The structure of claim 1, wherein the device regions include an active region of a planar structure.

18. A structure, comprising:
a first gate structure, a second gate structure, and a third gate structure, the second gate structure being positioned between and abutting the first gate structure and the third gate structure; and
conductive materials in the first, second, and third gate structures, the conductive materials of the second gate structure being different than the first gate structure and the third gate structure,
wherein the second gate structure comprise gate materials with different thicknesses than the gate materials of the first and third gate structure and wherein the conductive materials of the first gate structure and the third gate structure are over device regions, and the second gate structure is formed over a non-device region.

* * * * *